United States Patent [19]

Butler et al.

[11] 4,419,593
[45] Dec. 6, 1983

[54] ULTRA FAST DRIVER CIRCUIT

[75] Inventors: Neal R. Butler, Acton; Alan R. Carson, Billerica, both of Mass.

[73] Assignee: Honeywell Inc., Minneapolis, Minn.

[21] Appl. No.: 278,775

[22] Filed: Jun. 29, 1981

[51] Int. Cl.³ .................. H03K 5/01; H03K 17/60
[52] U.S. Cl. .................. 307/268; 307/288; 307/255; 307/443; 307/475
[58] Field of Search .............. 307/270, 268, 262, 300, 307/602, 443, 253, 254, 255, 291, 290, 261, 500

[56] References Cited

U.S. PATENT DOCUMENTS 3,359,433 12/1967 Thauland .................. 307/362
3,636,380 1/1972 Anderson .................. 307/261
3,864,584 2/1975 Hutson .................. 307/268
4,278,918 7/1981 Bachofer .................. 307/255

Primary Examiner—John S. Heyman
Assistant Examiner—Timothy P. Callahan
Attorney, Agent, or Firm—John S. Solakian; Laurence J. Marhoefer

[57] ABSTRACT

A driver circuit in which a signal received at an input gate provides, at the output of the circuit, a signal having fast rise and fall times and high voltage swings. The input stage of the circuit includes two transistors coupled in a complementary emitter follower arrangement and the output stage of the circuit includes two transistors in a complementary common emitter amplifier arrangement. The circuit includes separate high speed and low speed signal paths.

13 Claims, 4 Drawing Figures

ULTRA FAST DRIVER CIRCUIT

BACKGROUND OF THE INVENTION

The present invention relates generally to driver or level shifter circuits, and, more particularly, to high speed circuits used, for example, to drive charge coupled devices.

High speed driver circuits, which provide level shifting between, for example, transistor-transistor logic (TTL) logic levels and high voltage levels are necessary to drive charge coupled devices (CCD), which are, for example, used in infrared focal planes. Such circuits must have high speed capability, a high output voltage swing and yet be simple enough, with minimal components, so that several such circuits may be included in a small package. The output voltage must also have very fast rise and fall times. It is also desirable that the rise and fall times be essentially the same. The fast rise and fall times are convenient for providing a high speed clock. In addition, the fast rise and fall times are necessary for the high speed operation in the CCD application. However, there are other applications where the fast rise and fall times are necessary by themselves. In fact, one application may require a very low duty cycle at relatively low frequencies, requiring, however, fast rise and fall times just so that it can go to, for example, twenty volts and back again within the available time.

It is accordingly a primary object of the present invention to provide an improved high speed driver circuit for providing an output voltage having fast rise and fall times.

SUMMARY OF THE INVENTION

The above and other objects of the invention are achieved according to the present invention by providing a high speed driver circuit which, in response to an input signal, provides an output signal having fast rise and fall times. The circuit may include both a high speed signal path and a low speed signal path, each of which paths may be independently optimized. The input signal is received by input gate logic. Coupled to the input gate logic is a level shifting network for providing drive current in response to the input signal. An output transistor stage is coupled to be driven by the drive current to produce the output signal. The coupling to the output transistor stage includes capacitive elements for the high speed signal path, whereas the low speed signal path is independently coupled from the output of the input gate logic.

BRIEF DESCRIPTION OF THE DRAWINGS

The above and other objects of the present invention are achieved in the illustrative embodiments as described with respect to the Figures in which.

DETAILED DESCRIPTION OF THE PREFERRED EMBODIMENT(S)

Figure 1:
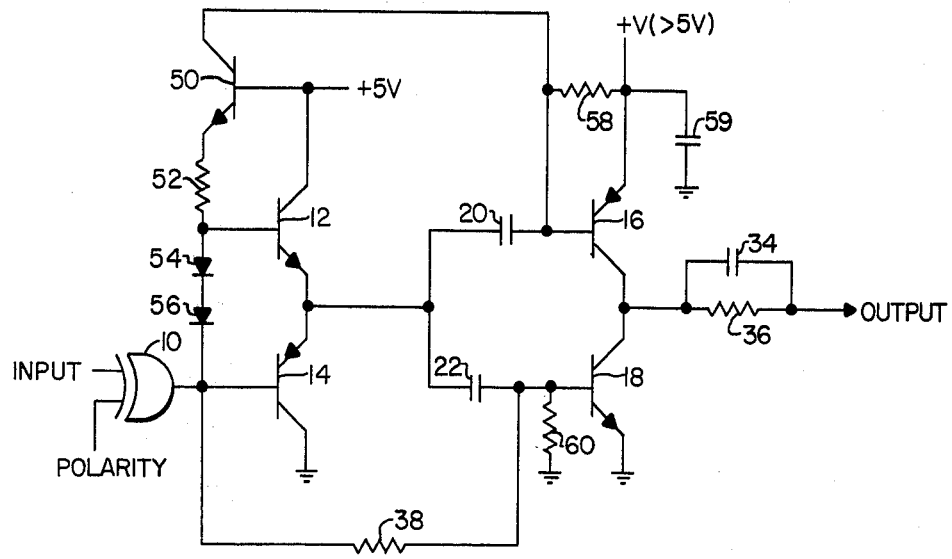
FIG. 1 illustrates a preferred embodiment of the circuit of the present invention.

The following is a description of the basic operation of the circuit of the present invention as shown in FIG. 1. The input signal, for example as received from a TTL (transistor-transistor logic) circuit, is received at one input of gate 10, which may be a Schottky TTL exclusive OR gate. An exclusive OR gate is used so that the overall level shifter can be either inverting or noninverting. The output of the gate 10 drives transistors 12 and 14, connected in a complementary emitter follower arrangement, and coupled with a level shifting network, including resistor 52 and diodes 54 and 56. The signal from the output of the emitter follower transistors 12 and 14 is coupled to the output transistors 16 and 18 via capacitors 20 and 22, respectively. Transistors 16 and 18 are coupled in a complementary common emitter amplifier arrangement. Resistor 36 and capacitor 34 serves to provide a termination impedance for a load such as, for example, a coaxial cable.

The polarity of the input signal may be, for example, a TTL logic level. If the polarity input is high, the circuit is noninverting, and if the polarity input is low, then the circuit is inverting. One of the unique features of the circuit of the present invention is the circuit's speed. Such speed is enhanced by use of the TTL gate 10, which has a high output drive current. The emitter follower transistors 12 and 14 provide still more drive current to the output stage. This signal is AC (alternating current) coupled to the output stage so that time delays, etc., in DC (direct current) level shifting components are not of concern. The driver circuitry, which includes gate 10 and transistors 12 and 14, provides the output stage with the highest available drive current, depending only on the transistors themselves. Thus, the output stage, since the transistors 16 and 18 are driven at the base electrodes as hard as possible, switches as fast as the transistors are capable. The transistors 12 and 14 that may be used in such circuit may be classified as VHF (very high frequency) power transistors. They have a frequency range of about one gigahertz or higher, voltage ratings of 30-40 volts, and power capabilities of several watts.

The circuit components that have not as yet been specifically described, are included for purposes of DC biasing. Resistor 52 and diodes 54 and 56 serve to change the output voltage swing of the gate 10 from about a range of one-half volt to three and one-half volts to about one volt more than that; that is, to an output range between about one and one-half volts to four and one-half volts. This shift allows transistor 12 to conduct sooner than it would normally without the diodes. It also provides an output voltage swing at the emitter electrodes of transistors 12 and 14 that is nearly the same as the voltage swing at the output of gate 10.

Each of the output transistors 16 and 18 are coupled by means of an AC circuit path for high speed signal applications. If the application of the circuit is such that a constant frequency signal is received by the circuit, then only the AC coupling is necessary, and only the components already mentioned are required for proper circuit operation. However, if the input frequency is variable or not known in advance, it is convenient to have additional components that allow the circuit to operate with any on-time and any off-time, i.e., any frequency.

For output transistor 18, the DC bias is provided through resistor 38. This resistor provides current to transistor 18 after the initial pulse, which is received by the pass of transistor 18 through capacitor 22, has decayed. Resistor 52 and transistor 50 provide DC bias to output transistor 16 to keep it turned on after such initial pulse decays. Transistor 50 provides a level shifting from the 5 volt level, that is available at its base input, to the positive output voltage. Such output voltage should be greater than 5 volts for the level shifter to work properly. The criteria is that the voltage at the emitter of transistor 16 be larger than the voltage at the base of transistor 50. In this circuit, the voltage at the base of transistor 50 is set to 5 volts, because 5 volts is also used to provide power to gate 10. Resistors 58 and 60 serve to discharge the coupling capacitors 20 and 22 while the associated transistor is turned off. Without these resistors, the capacitors would not discharge during the part of the cycle when the transistor is off, and, thus, they could not be charged up again to provide base drive to turn the transistors on.

The configuration of the circuit of the present invention must be carefully set out due to the high frequency operation thereof. Thus, it is important that the emitters of transistors 16 and 18 be grounded through a very low impedance path. The inductance in these emitters, even the inductance of an inch of wire, slows the rise and fall times significantly. Since the emitter of transistor 16 is not at DC ground, it must be grounded through a low inductance path which may include capacitors. The circuit uses these capacitors in a star configuration to achieve low inductance to the ground plane. In FIG. 1, capacitor 59 represents this parallel star combination of capacitors to achieve a high frequency, low inductance path in order to ground the emitter of transistor 16.

Thus, the circuit of the present invention has a high frequency signal path that goes through the TTL gate 10, transistors 12 and 14, capacitors 20 and 22, and transistors 16 and 18. The circuit also includes a low frequency path through resistor 38, rather than transistor 14 and capacitor 22, and also through resistor 52 and transistor 50, instead of through transistor 12 and capacitor 20. The purpose of these separate high and low frequency paths is to allow each path to be separately optimized for its purpose. The high frequency path can be very fast, whereas the low frequency path may be very slow and have arbitrary duty cycles and operating frequencies, each without interferring with the function of the other path. Previous circuits have tended to have a single path, and, thus, often have been more complicated, or slower, or both. The low frequency path is necessary when the frequency of operation is not known in advance. If the operating frequency is known, then the parameters of the high frequency path can be set so that it will operate properly at the desired operating frequency.

Figure 2:
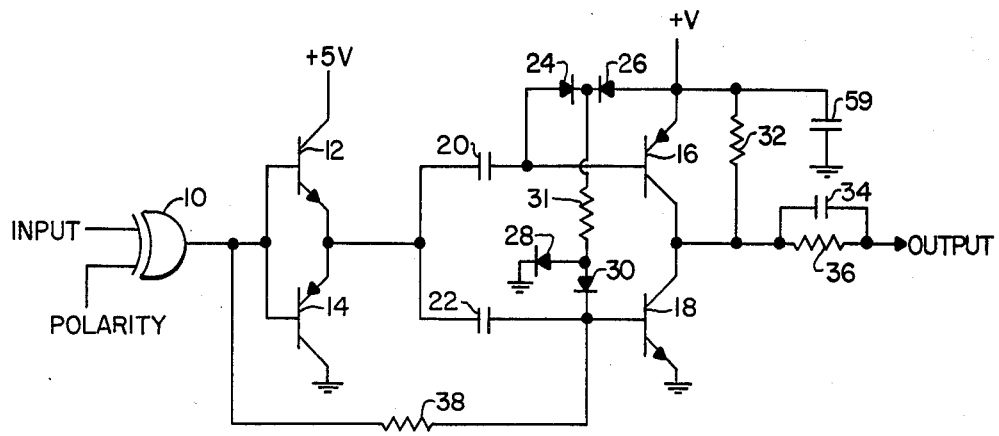
FIGS. 2, 3 and 4 illustrate alternative embodiments of the circuit of the present invention.

Now referring to FIG. 2, there is shown a different embodiment of the circuit of FIG. 1. The differences here are in the way the drive voltage of the output stage is determined and the way the DC gain path is implemented. The DC gain path is through resistor 38 and resistor 32. In this case, if the output level is low, transistor 18 is on and is held on indefinitely by current through resistor 38. If the output is to be high, then both transistors 16 and 18 are off, and the output is held high by resistor 32. This contrasts with the circuit of FIG. 1 where either transistor 16 or transistor 18 is always on.

The output drive voltage available in the circuit of FIG. 2 is lower than that available in the circuit of FIG. 1 because diodes 54 and 56 are not present. This is compensated for by the network of diodes 24, 26, 28 and 30, which increase the voltage available to charge capacitors 20 and 22. Resistor 31 and diodes 24 and 28 respectively provide voltages that are approximately half a volt less than the +V voltage, and approximately a half volt higher than ground. Diode 26 and diode 30 allow capacitors 20 and 22, respectively, to charge to a higher voltage then would otherwise be the case without the use of diodes 24 and 28 and resistor 31. Thus, the junction of diodes 24 and 26 is half a volt below the +V voltage, while the junction of diodes 28 and 30 is a half volt above ground.

Figure 3:
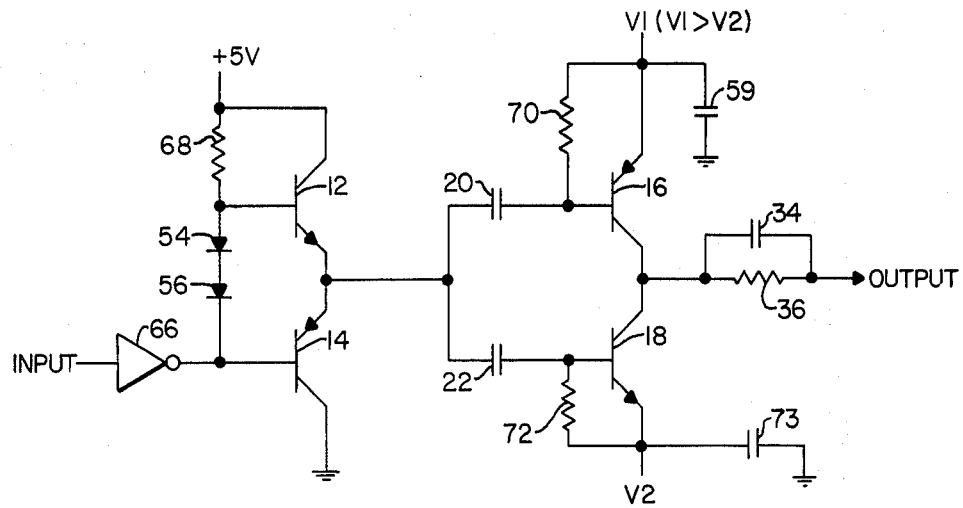

FIG. 3 shows an implementation of another circuit in accordance with the teachings of the present invention. However, no DC gain path is included. This circuit shows only the components that are involved in the AC gain path, that is, the path that provides for the high frequency operation of the circuit. This circuit is used where the duty cycle or repetition rate is such that each transistor is not required to be on for more than about a microsecond. If either of the output transistors is required to be on for substantially more than a microsecond, then the DC gain path is required. The circuit of FIG. 3 may use an inverting TTL gate as an alternative input. In such case, the overall level shifter is noninverting and no provision is made for switching between the inverting and noninverting capability. This reduces the propagation delay slightly. In the circuit of FIG. 3, resistor 68 serves the same function as resistor 52 in the circuit of FIG. 1; resistor 70 serves the same function as resistor 58 in the circuit of FIG. 1; and resistor 72 serves the same function as resistor 60 in the circuit of FIG. 1. Since there is no DC level shifting involved in the circuit of FIG. 3, the only requirement for voltages V1 and V2 is that V1 be greater than V2. Either voltage V1 or V2 may be at ground level. Capacitor 73 provides a low inductance path between the emitter of transistor 18 and ground.

Figure 4:
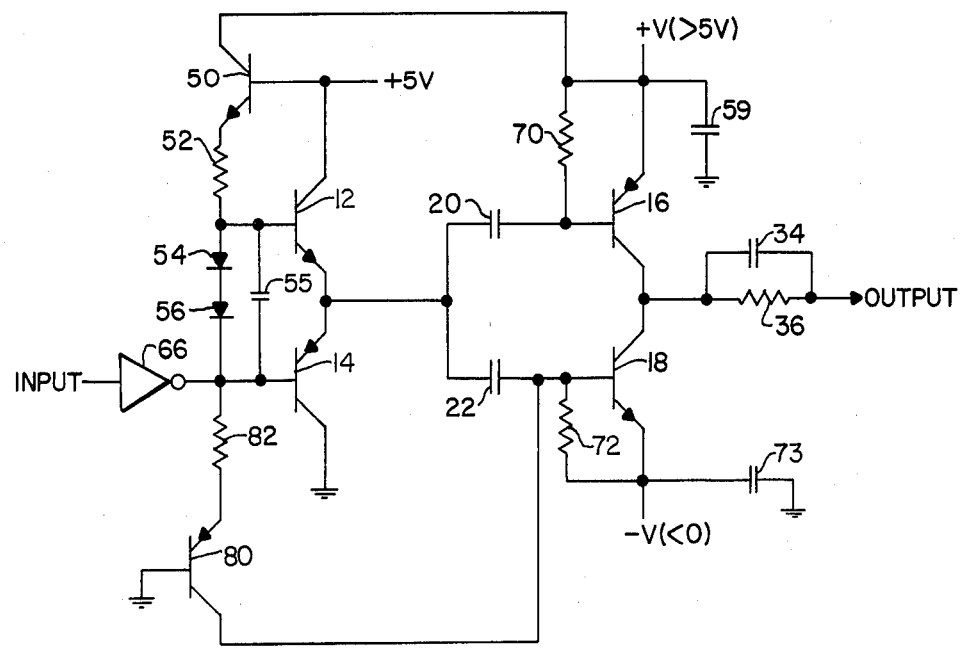

Diodes 54 and 56, in each of the circuits of FIGS. 1 and 3, as well as in FIG. 4 except as described below, may be power rectifier diodes which have a very long reverse recovery time. This property is used to advantage in these circuits by forcing the base of transistor 12 to follow the input signal. If high speed switching diodes are used in these circuits, it is necessary to connect a capacitor between the base of transistor 12 and the base of transistor 14 to complete the high frequency gain path. Use of power rectifier diodes, thereby providing a higher voltage swing, also enables use of smaller values for the coupling capacitors 20 and 22 and, in addition, reduces the precautions needed for grounding the emitters of transistors 16 and 18. In FIG. 4, capacitor 55 is shown coupled across diodes 54 and 56, which, in such embodiment, would be high speed diodes to complete the high frequency path and provide a large positive base current to the base of transistor 12 in response to the input signal. Without capacitor 55, diodes 54 and 56 would be power rectifier diodes.

FIG. 4 illustrates another embodiment of the circuit of the present invention. This circuit includes a DC gain path which allows a negative voltage swing. The additional components are resistor 82 and transistor 80. These components provide current to transistor 18 to keep it on for a period of time greater than a microsecond, while at the same time allowing the emitter voltage of transistor 18 to be less than ground. In the circuit of FIG. 4, resistor 82 and transistor 80 serve the function of resistor 38 in the circuit of FIG. 1.

Having described the invention, what is claimed as new and novel and for which it is desired to secure Letters Patent is:

1. A circuit comprising:
  A. input logic for receiving an input signal;
  B. output logic for providing an output signal in response to a drive current;

C. logic means coupled to said input logic for providing said drive current in response to said input signal;

D. means for coupling said drive current for receipt by said output logic;

E. means for providing a high speed signal path and a low speed signal path, said high speed signal path including said means for coupling and said high speed signal path coupled between said logic means and said output logic, and said low speed signal path coupled between said input logic and said output logic, wherein said high and low speed signal paths are operative substantially independent of each other;

F. wherein said logic means includes two transistors having their respective emitters coupled together and to said output logic; and G. wherein said output logic includes two transistors having their respective collectors coupled together and also includes two capacitive elements, one end of each of said elements coupled together and to the junction of the emitters of said transistor included in said logic means, and the other end of said elements coupled to the bases respectively of the two transistors included in said output logic.

2. A circuit as in claim 1 further comprising a termination network coupled to the junction of the collectors of said transistors included in said output logic and selected so as to be compatible with the electrical characteristics of a receiving device.

3. A circuit as in claim 1 wherein said input logic includes a gate having two inputs, one for receiving said input signal and the other for receiving a polarity signal, whereby the presence of a first state of said polarity signal makes said circuit inverting and wherein a second state of said polarity signal makes said circuit noninverting.

4. A circuit as in claim 1 wherein said input logic includes an input for receiving said input signal and also includes an output, and wherein said circuit further comprises means for coupling said output of said input logic to the base of one of said transistors included in said output logic, said means for coupling comprising said low speed signal path.

5. A circuit as in claim 1 wherein said logic means includes a voltage level shifting network coupled so that the voltage swing associated with said drive current is increased.

6. A circuit as in claim 5 wherein said network includes at least one diode means which has a relatively high power handling capability and which has a relatively long reverse recovery time when compared to high speed diodes normally used in high speed circuits.

7. A high speed circuit comprising:

A. input logic for receiving an input signal;

B. first and second transistors coupled in a complementary emitter follower arrangement, wherein the emitters of said transistors are coupled together and wherein the base of at least one of said transistors is coupled to said input logic;

C. first and second capacitive elements each having one end coupled to the emitters of said first and second transistors; and D. third and fourth transistors each having collectors coupled together to provide an output of said circuit, wherein the base of said third transistor is coupled to the other end of one of said capacitive elements, and wherein the base of said fourth transistor is coupled to the other end of the other one of said capacitive elements.

8. A circuit as in claim 7 further comprising a low speed circuit path between said input logic and the base of said fourth transistor.

9. A circuit as in claim 7 further comprising first and second diode elements coupled between the junction of said input logic and the base of said second transistor and the base of said first transistor so as to provide a higher voltage swing in respone to said input signal, at the junction of the emitters of said first and second transistors.

10. A circuit as in claim 9 wherein said first and second diode elements have a relatively high power handling capability and a relatively long reverse recovery time when compared to high speed diode elements normally used in high speed circuits.

11. A circuit comprising:

A. input logic for receiving an input signal;

B. output logic for providing an output signal in response to a drive current, wherein said logic means includes a voltage level shifting network coupled so that the voltage swing associated with said drive current is increased;

C. logic means coupled to said input logic for providing said drive current in response to said input signal;

D. means for coupling said drive current for receipt by said output logic; and

E. means for providing a high speed signal path and a low speed signal path, said high speed signal path including said means for coupling and said high speed signal path coupled between said logic means and said output logic, and said low speed signal path coupled between said input logic and said output logic, wherein said high and low speed signal paths are operative substantially independent of each other.

12. A circuit as in claim 11 wherein said network includes at least one diode means which has a relatively high power handling capability and which has a relatively long reverse recovery time when compared to high speed diodes normally used in high speed circuits.

13. A circuit comprising:

A. input logic for receiving an input signal:

B. output logic, having an input connection, for providing an output signal in response to a drive current;

C. logic means coupled to said input logic for providing said drive circuit in response to said input signal;

D. means for coupling said drive current for receipt by said output logic;

E. means for providing a high speed signal path and a low speed signal path, said high speed signal path including said means for coupling and said high speed signal path coupled between said logic means and said output logic, and said low speed signal path coupled between said input logic and said output logic, wherein said high and low speed signal paths are operative substantially independent of each other; and F. wherein said logic means includes two transistors having their respective emitters coupled together and to said input connection of said output logic.

* * * * *